(12) United States Patent
Yoon et al.

(10) Patent No.: US 8,233,339 B2
(45) Date of Patent: Jul. 31, 2012

(54) SEMICONDUCTOR MEMORY DEVICE

(75) Inventors: Hyun-Su Yoon, Gyeonggi-do (KR);
Jong-Chern Lee, Gyeonggi-do (KR);
Seung-Joon Ahn, Gyeonggi-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 148 days.

(21) Appl. No.: 12/875,803

(22) Filed: Sep. 3, 2010

(65) Prior Publication Data

US 2012/0008433 A1    Jan. 12, 2012

(30) Foreign Application Priority Data

Jul. 6, 2010 (KR) ........................ 10-2010-0064903

(51) Int. Cl.
*G11C 7/00* (2006.01)
(52) U.S. Cl. ................ 365/194; 365/233.1; 365/233.14; 365/236
(58) Field of Classification Search .................. 365/194, 365/236, 233.1, 233.14
See application file for complete search history.

(56) References Cited

FOREIGN PATENT DOCUMENTS

| KR | 1020010077601 | 8/2001 |
|---|---|---|
| KR | 100625298 | 9/2006 |
| KR | 1020080002590 | 1/2008 |

OTHER PUBLICATIONS

Notice of Allowance issued from Korean Intellectual Property Office on Sep. 30, 2011.

*Primary Examiner* — Son Dinh
(74) *Attorney, Agent, or Firm* — IP & T Group LLP (57) ABSTRACT

A semiconductor memory device includes an open-loop-type delay locked loop (DLL) configured to generate a clock signal locked by reflecting a first delay amount which actually occurs in a data path and a second delay amount which is required for locking the clock signal, a latency control unit configured to shift an inputted command according to a latency code value corresponding to the first delay amount and latency information, and output the shifted command, and an additional delay line configured to delay the shifted command according to a delay code value corresponding to the second delay amount, and output the command of which operation timing is controlled.

29 Claims, 8 Drawing Sheets

SEMICONDUCTOR MEMORY DEVICE

CROSS-REFERENCE TO RELATED APPLICATIONS

The present application claims priority of Korean Patent Application No. 10-2010-0064903, filed on Jul. 6, 2010, which is incorporated herein by reference in its entirety.

BACKGROUND OF THE INVENTION

Exemplary embodiments of the present invention relate to semiconductor design technology, and more particularly, to a semiconductor memory device.

If a write command is inputted, a semiconductor memory device, for example, DRAM DDR3 operates in synchronization with a clock signal according to dynamic on-die termination (DODT). Furthermore, if an on-die termination (ODT) command is inputted, the semiconductor memory device operates in synchronization with a clock signal according to normal ODT. Furthermore, if a read command is inputted, a data output operation of the semiconductor memory device operates in synchronization with a clock signal according to CAS write latency (CWL) and read latency (RL) determined by a mode register set (MRS). Here, the RL may be expressed as the sum of additive latency (AL) and CAS latency (CL).

In particular, an ODT operation and a read operation are performed within the RL or CWL. In order that the ODT operation and the read operation are performed at a timing specified by Joint Electron Device Engineering Council (JEDEC) from when write/read/ODT commands are inputted, the semiconductor memory device may delay the corresponding commands by using the RL or CWL such that the corresponding command is in accord with an external clock signal regardless of operation frequencies or various conditions.

Korean Patent No. 625298 (hereafter, referred to as the related art) has disclosed a technology which is capable of determining an enable time of an ODT circuit by using latency information. The technology proposes a control method which compares an external clock counting signal and a delay locked loop (DLL) clock counting signal. However, this method may require a large area of a semiconductor memory device and a continuous operation by a counter. Therefore, unnecessary power consumption may occur.

Meanwhile, if data are transferred from one area to another area in the semiconductor memory system which operates in synchronization with a clock signal, an operation for synchronizing the data with the clock signal of the other area is required. Here, the operation for transferring data to the other area is referred to as a domain crossing operation. That is, the domain crossing operation is an operation for synchronizing a data output enable signal with, for example, a clock signal of a DLL.

In such a domain crossing operation, when the data output enable signal is outputted in synchronization with the clock signal of the DLL, delay may occur in a data path. Therefore, as the operation frequency of the semiconductor memory device increases, it becomes difficult to control the data output enable signal in accord with an activation time. Moreover, an area for a domain crossing block is required. For this reason, the domain crossing operation may act as a limitation in designing the semiconductor memory device.

Meanwhile, the DLL included in the semiconductor memory device generally has a closed loop type. The closed-loop-type DLL may perform several feedback operations until locking is accomplished. Therefore, much time may be required for the locking, and power consumption may increase. For reference, the locking refers to an operation for generating an internal clock signal obtained by compensating for a delay element inside the semiconductor memory device with respect to an external clock signal.

SUMMARY OF THE INVENTION

Exemplary embodiments of the present invention are directed to a semiconductor memory device having an optimized area and power consumption.

In accordance with an exemplary embodiment of the present invention, a semiconductor memory device includes an open-loop-type delay locked loop (DLL) configured to generate a clock signal locked by reflecting a first delay amount which actually occurs in a data path and a second delay amount which is required for locking the clock signal, a latency control unit configured to shift an inputted command according to a latency code value corresponding to the first delay amount and latency information, and output the shifted command, and an additional delay line configured to delay the shifted command according to a delay code value corresponding to the second delay amount, and output the command of which operation timing is controlled.

In accordance with another exemplary embodiment of the present invention, a semiconductor memory device includes an open-loop-type DLL configured to generate a clock signal locked by reflecting a first delay amount which actually occurs in a data path and a second delay amount which is required for locking the clock signal, a latency coding unit configured to receive a first delay amount pulse having a pulse width corresponding to the first delay amount from the open-loop-type DLL, measure the pulse width of the first delay amount pulse, and output a latency code value, an additional delay line configured to delay a command according to a delay code value corresponding to the second delay amount inputted from the open-loop-type DLL, and output the delayed command, and a latency control unit configured to shift the delayed command based on the latency code value and latency information, and output the command of which operation timing is controlled.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
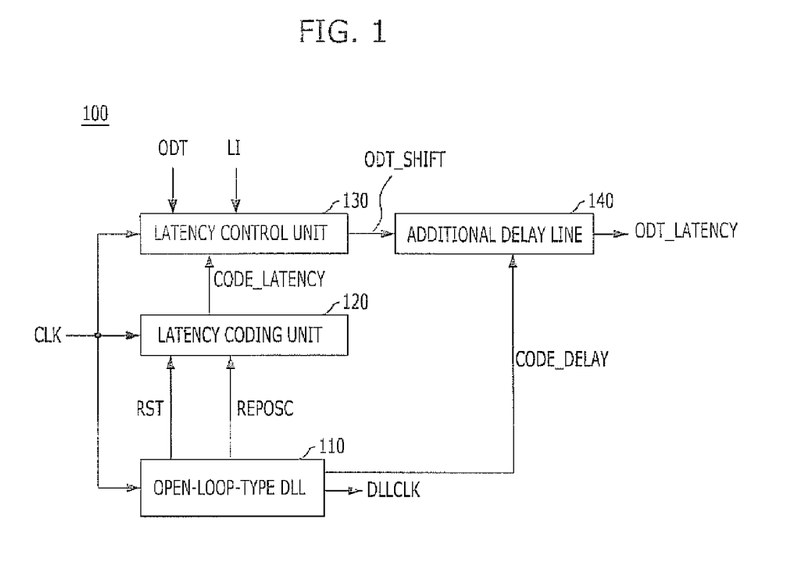
FIG. 1 is a block diagram of a semiconductor memory device in accordance with an exemplary embodiment of the present invention.

FIG. 1 is a block diagram of a semiconductor memory device in accordance with an exemplary embodiment of the present invention.

Referring to FIG. 1, the semiconductor memory device 100 includes an open-loop-type DLL 110, a latency coding unit 120, a latency control unit 130, and an additional delay line 140. The open-loop-type DLL 110 is configured to generate a locked clock signal DLLCLK by reflecting a first delay amount which actually occurs in a data path and a second delay amount which is required for locking a clock signal. The latency coding unit 120 is configured to receive a first delay amount pulse REPOSC having a pulse width corresponding to the first delay amount from the open-loop-type DLL 110, and measure the pulse width of the first delay amount pulse REPOSC to output a latency code value CODE_LATENCY. The latency control unit 130 is configured to shift an ODT command according to the latency code value CODE_LATENCY and latency information LI, and output the shifted ODT command ODT_SHIFT. The additional delay line 140 is configured to delay the shifted ODT command ODT_SHIFT according to a delay code value CODE_DELAY corresponding to the second delay amount inputted from the open-loop-type DLL 110 and output an operation-timing-controlled ODT command ODT_LATENCY. Meanwhile, the latency coding unit 120 updates the latency code value CODE_LATENCY in response to a reset signal RST applied from the open-loop-type DLL 110. Here, the semiconductor memory device 100 may use a clock signal CLK which refers to an external clock signal.

Figure 2:
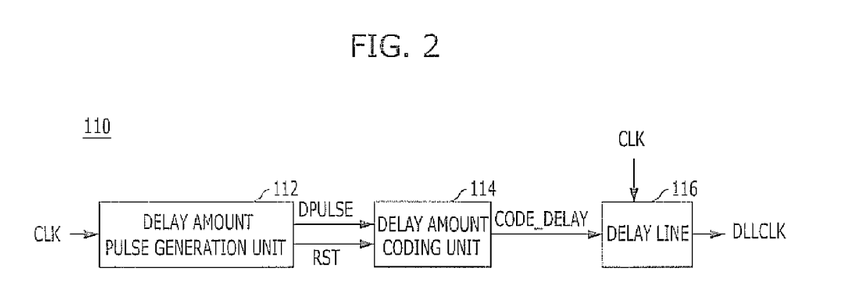
FIG. 2 is a block diagram of an open-loop-type DLL of FIG. 1.
Figure 3:
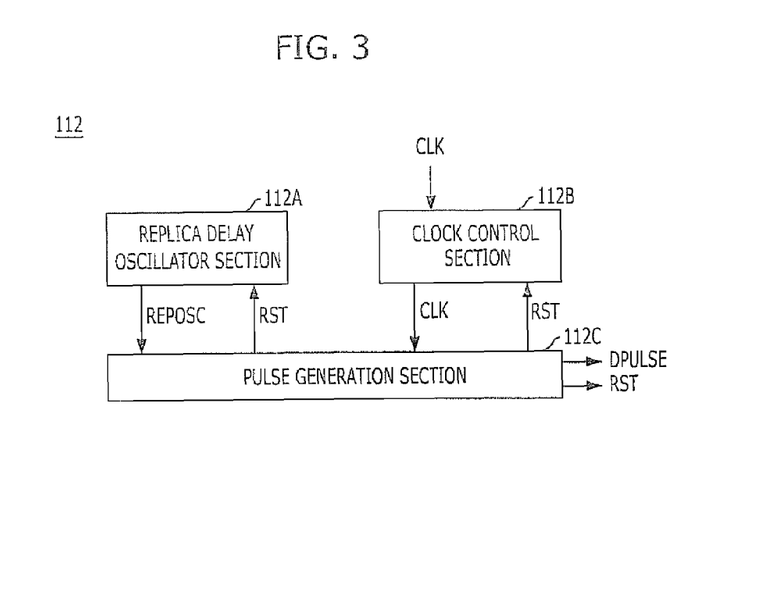
FIG. 3 is a block diagram of a delay amount pulse generation unit of FIG. 2.
Figure 4:
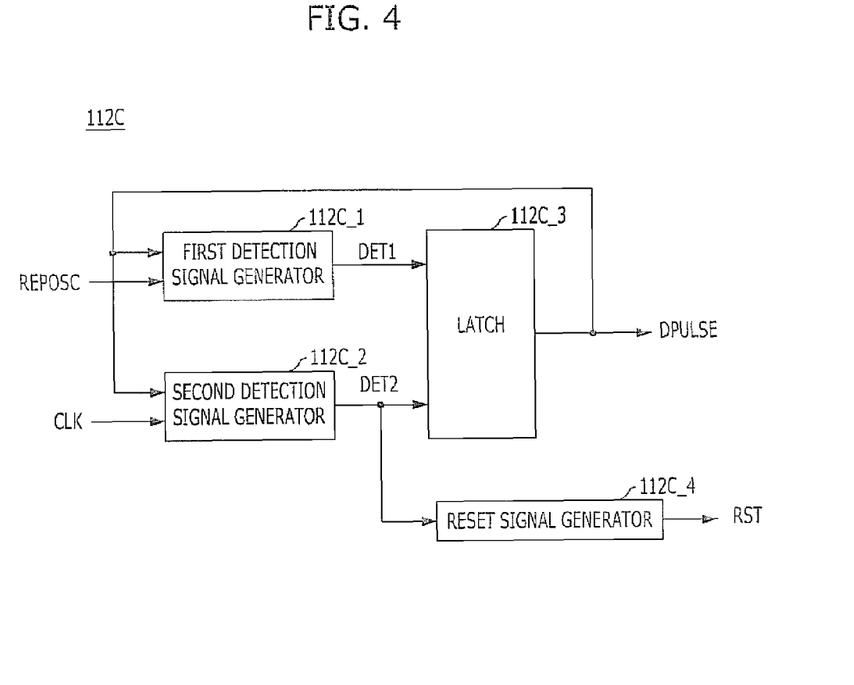
FIG. 4 is a block diagram of a pulse generation section of FIG. 3.
Figure 5A:
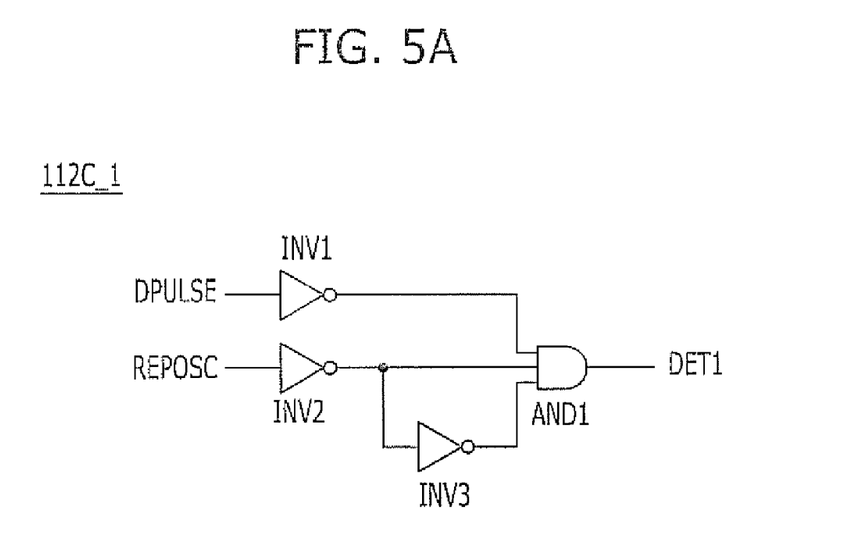
FIG. 5A is an internal circuit diagram of a first detection signal generator of FIG. 4.
Figure 5B:
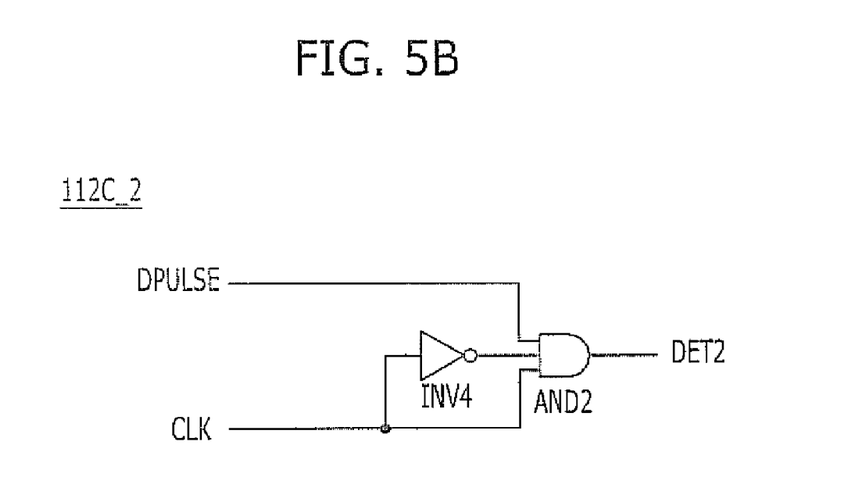
FIG. 5B is an internal circuit diagram of a second detection signal generator of FIG. 4.
Figure 6:
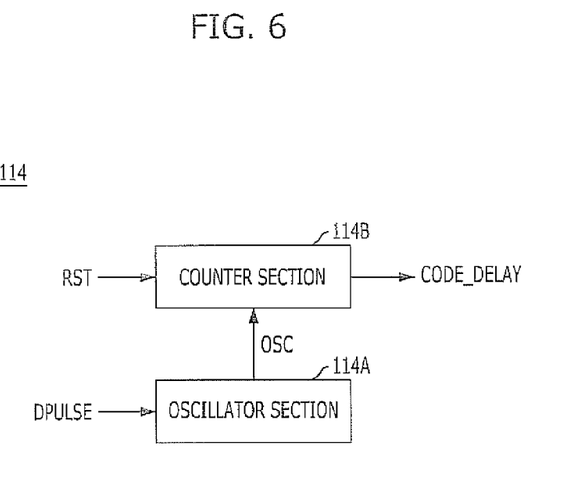
FIG. 6 is a block diagram of a delay amount coding unit of FIG. 2.

Referring to FIGS. 2 to 6, the open-loop-type DLL 110 will be described. FIG. 2 is a block diagram of the open-loop-type DLL 110. FIG. 3 is a block diagram of a delay amount pulse generation unit 112 of FIG. 2. FIG. 4 is a block diagram of a pulse generation section 112C of FIG. 3. FIG. 5A is an internal circuit diagram of a first detection signal generator 112C_1 of FIG. 4, and FIG. 5B is an internal circuit diagram of a second detection signal generator 112C_2 of FIG. 4. FIG. 6 is a block diagram of a delay amount coding unit 114 of FIG. 2.

Referring to FIG. 2, the open-loop-type DLL 110 includes a delay amount pulse generation unit 112, a delay amount coding unit 114, and a delay line 116. The delay amount pulse generation unit 112 is configured to generate a second delay amount pulse DPULSE. The delay amount coding unit 114 is configured to measure the pulse width of the second delay amount pulse DPULSE and output the delay code value CODE_DELAY. The delay line 116 is configured to delay the clock signal CLK in response to the delay code value CODE_DELAY outputted from the delay amount coding unit 114.

Referring to FIG. 3, the delay amount pulse generation unit 112 includes a replica delay oscillator section 112A, a clock control section 112B, and a pulse generation section 112C. The replica delay oscillator section 112A is configured to output the first delay amount pulse REPOSC, having a pulse width corresponding to the first delay amount which is a delay time occurring in the data path, in response to the reset signal RST. The clock control section 112B is configured to output the clock signal CLK in response to the reset signal RST. The pulse generation section 112C is configured to receive the first delay amount pulse REPOSC and the clock signal CLK outputted from the clock control section 112B, and output the second delay amount pulse DPULSE. Here, the pulse generation section 112C also serves to generate the reset signal RST.

Referring to FIG. 4, the configuration of the pulse generation section 112C will be described in more detail. The pulse generation section 112C includes a first detection signal generator 112C_1, a second detection signal generator 112C_2, a latch 112C_3, and a reset signal generator 112C_4. The first detection signal generator 112C_1 is configured to generate a first detection signal DET1 which is activated, for example, at a falling edge of the first delay amount pulse REPOSC. The second detection signal generator 112C_2 is configured to generate a second detection signal DET2 which is activated, for example, at a rising edge of the clock signal CLK after the generation of the first detection signal DET1. The latch 112C_3 is configured to receive the first and second detection signals DET1 and DET2 and output the second delay amount pulse DPULSE which is activated at an activation time of the first detection signal DET1 and deactivated at an activation time of the second detection signal DET2. The reset signal generator 112C_4 is configured to receive the second detection signal DET2 and delay the received second detection signal DET2 by a certain time, and output the reset signal RST.

Referring to FIG. 5A, the first detection signal generator 112C_1 includes a first inverter INV1, a second inverter INV2, a third inverter INV3, and a first AND gate AND1. The first inverter INV1 is configured to invert the second delay amount pulse DPULSE, the second inverter INV2 is configured to invert the first delay amount pulse REPOSC, and the third inverter INV3 is configured to invert the output signal of the second inverter INV2. The first AND gate AND1 is configured to perform an AND operation on the output signal of the first inverter INV1, the output signal of the second inverter INV2, and the output signal of the third inverter INV3, and output the first detection signal DET1.

Referring to FIG. 5B, the second detection signal generator 112C_2 includes a fourth inverter INV4 and a second AND gate AND2. The fourth inverter INV4 is configured to invert the clock signal CLK, and the second AND gate AND2 is configured to perform an AND operation on the second delay amount pulse DPULSE, the clock signal CLK, and the output signal of the fourth inverter INV4, and output the second detection signal DET2.

Although not illustrated, the latch 112C_3 may be implemented by using an RS flip-flop. In this case, when the first detection signal DET1 is inputted to a set terminal of the RS flip-flop and the second detection signal DET2 is inputted to a reset terminal of the RS flip-flop, the second delay amount pulse DPULSE may be generated.

Referring to FIG. 6, the delay amount coding unit 114 includes an oscillator section 114A and a counter section 114B. The oscillator section 114A is configured to generate an oscillation signal OSC in response to the second delay amount pulse DPULSE. The counter section 114B is configured to count periods of the oscillation signal OSC and encode the counted period to output the delay code value CODE_DELAY. In particular, the counter section 114B also serves to update the delay code value CODE_DELAY in response to the reset signal RST, in order to deal with process/voltage/temperature (PVT) variations.

The open-loop-type DLL 110 configured in the above-described manner has an advantage in that the time required for locking may be reduced and thus the power consumption may decrease, compared with a closed-loop-type DLL.

Referring to FIG. 1 again, the latency coding unit 120 may include a counter section which is configured to count a toggling number of the clock signal during an activation of the first delay amount pulse REPOSC and output the latency code value CODE_LATENCY. Like the counter section 114B of the delay amount coding unit 114, the latency coding unit 120 may update the latency code value CODE_LATENCY in response to the reset signal RST, in order to deal with PVT variations.

Figure 7:
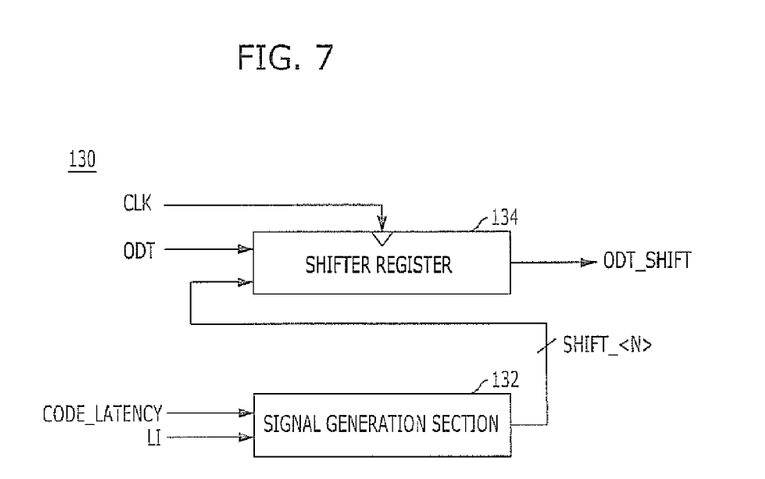
FIG. 7 is a block diagram of a latency control unit of FIG. 1.
Figure 8A:
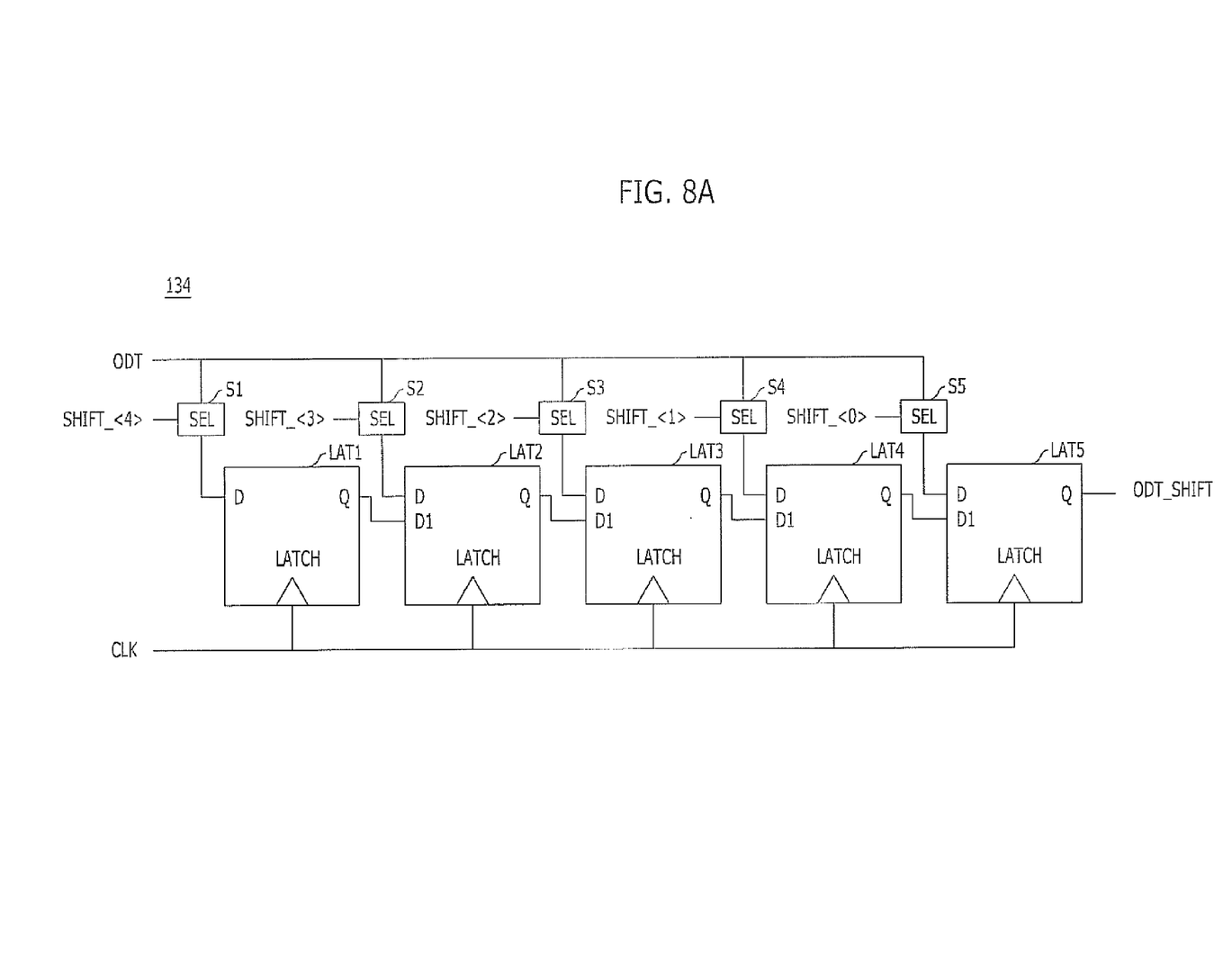
FIG. 8A is a block diagram illustrating an example of a shift register of FIG. 7.
Figure 8B:
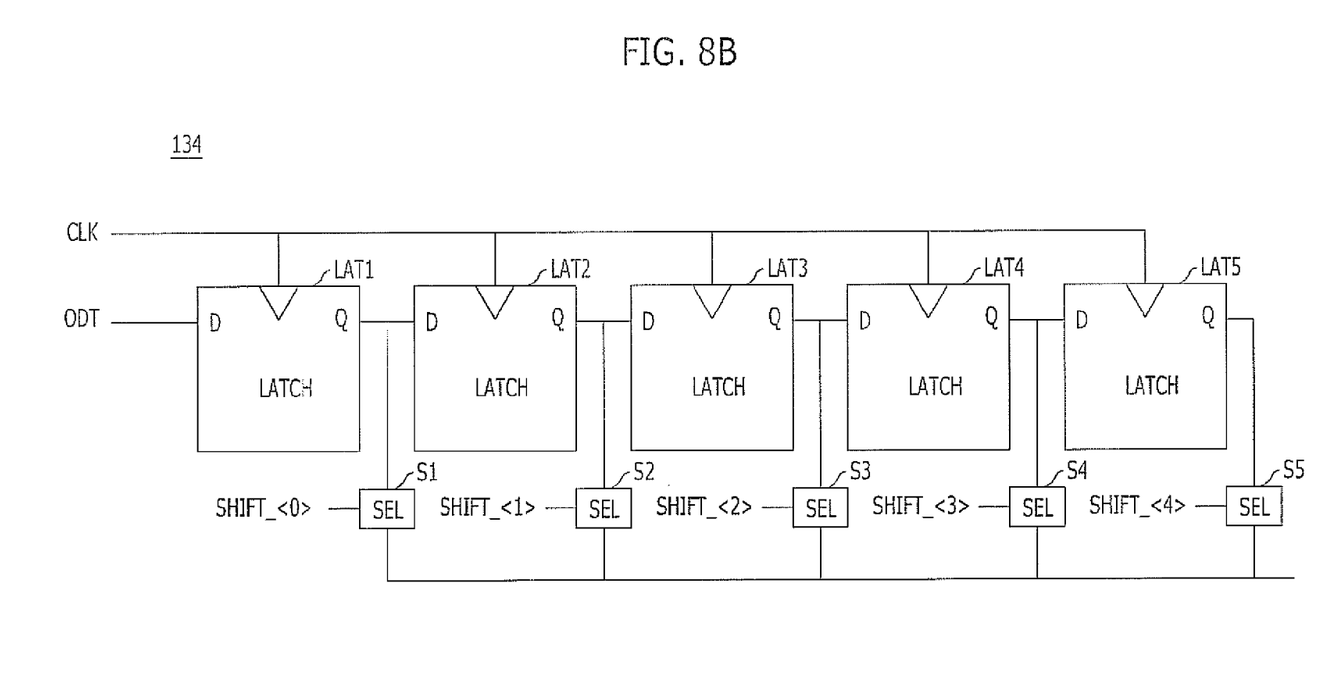
FIG. 8B is a block diagram illustrating another example of the shift register of FIG. 7.

Referring to FIGS. 7 and 8, the latency control unit 130 will be described in more detail. FIG. 7 is a block diagram of the latency control unit 130. FIG. 8A is a block diagram illustrating an example of a shift register of FIG. 7, and FIG. 8B is a block diagram illustrating another example of the shift register of FIG. 7.

Referring to FIG. 7, the latency control unit 130 includes a signal generation section 132 and a shift register 134. The signal generation section 132 is configured to generate a latency control signal SHIFT_<N> based on the latency code value CODE_LATENCY and the latency information LI. The shift register 134 is configured to shift the ODT command in response to the latency control signal SHIFT_<N>. Here, the latency information LI refers to CAS write latency (CWL) or CAS latency (CL) set in a mode register set (MRS). In this exemplary embodiment, since the ODT command is inputted, the latency information LI corresponds to the CWL.

The signal generation section 132 may include a full adder or subtractor, and generates the latency control signal SHIFT_<N> based on an equation expressed as: CWL−2tCK−CODE_LATENCY. For example, when the CWL is set to 5 clock cycles (5 tCK) and the latency code value CODE_LATENCY is 2 clock cycles (2 tCK), the signal generation section 132 generates a latency control signal SHIFT_<N> corresponding to 1 clock cycle (1 tCK) according to the equation expressed as: CWL−2tCK−CODE_LATENCY. In this case, it can be seen that the latency control signal SHIFT_<N> reflects a delay time occurring in the data path into the latency of the ODT command, such that the ODT command may be outputted at a time defined in the specification.

When shifting the ODT command, the shift register 134 synchronizes the ODT command with the clock signal CLK and outputs the shifted ODT command ODT_SHIFT. The configuration of the shift register 134 may be divided into two general cases. FIG. 8A shows an exemplary configuration of the first general case in which the shift register 134 shifts the ODT command by controlling an input in response to the latency control signal SHIFT_<N> transferred from the signal generation section 132, and FIG. 8B shows an exemplary configuration of the second general case in which the shift register 134 shifts the ODT command by controlling an output in response to the latency control signal SHIFT_<N> transferred from the signal generation section 132. Referring to FIG. 8A, the shift register 134 includes first to fifth latches LAT1 to LAT5 which are coupled and arranged in series, and applies the clock signal CLK to the respective latches LAT1 to LAT5. Here, one of the latches LAT1 to LAT5 is selected in response to the latency control signal SHIFT_<N> transferred from the signal generation section 132 such that the CDT command is inputted to the selected latch. Then, the ODT command is shifted while sequentially passing through other latches which are serially coupled between the selected latch and an output terminal of the shift register 134. For example, when the latency control signal SHIFT<N> is a latency control signal SHIFT_<4>, the first latch LAT1 is selected, and the ODT command sequentially passes through the first to fifth latches LAT1 to LAT5. Then, the shifted ODT command ODT_SHIFT corresponding to the latency control signal SHIFT_<N> is outputted. Referring to FIG. 8B, the shift register 134 includes first to fifth latches LAT1 to LAT5 which are coupled and arranged in series, and applies the clock signal CLK to the respective latches LAT1 to LAT5. Here, the shift register 134 selects one of ODT commands which are already shifted through from one to all of the first to fifth latches LAT1 to LAT5, in response to the latency control signal SHIFT_<N> transferred from the signal generation section 132, and outputs the shifted ODT command ODT_SHIFT. In other words, the ODT command sequentially passes through all of the first to fifth latches LAT1 to LAT5, and the shift register 134 holds the shifted ODT commands outputted from the first to fifth latches LAT1 to LAT5 at each output terminal, respectively. Then, the shifter register 134 outputs only one of the shifted ODT commands as the shifted ODT command ODT_SHIFT in response to the latency control signal SHIFT_<N>.

Meanwhile, the additional delay line 140 may be configured in the same manner as the delay line 116 included in the open-loop-type DLL 110. However, a target delayed by the additional delay line 140 is different from that delayed by the delay line 116.

Hereafter, the operation of the semiconductor memory device 100 in accordance with an exemplary embodiment of the present invention will be described with reference to FIGS. 9 and 10.

Figure 9:
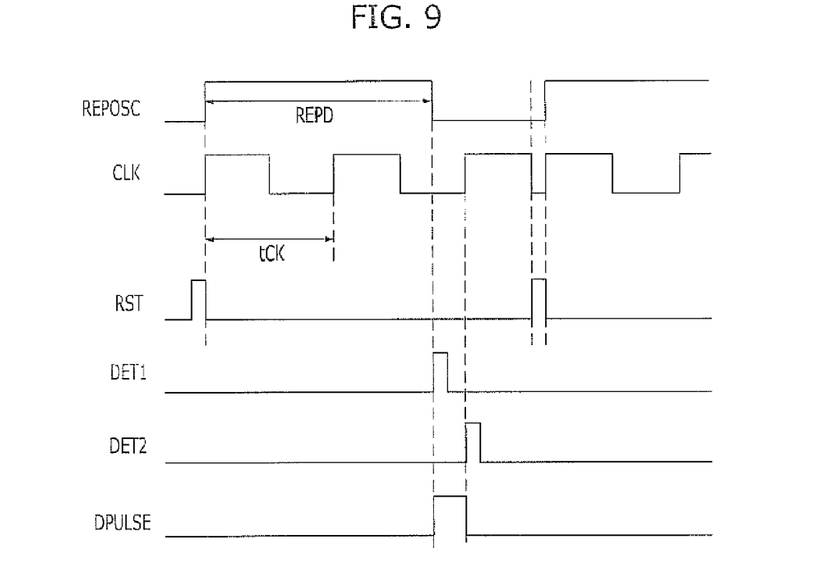
FIG. 9 is a timing diagram explaining the operation of the open-loop-type DLL of FIG. 1.

FIG. 9 is a timing diagram explaining the operation of the open-loop-type DLL 110 of FIG. 1. FIG. 10 is a timing diagram explaining the operations of the latency control unit 130 and the additional delay line 140 of FIG. 1.

Referring to FIG. 9, the replica delay oscillator section 112A outputs a first delay amount pulse REPOSC having a pulse width REPD, corresponding to a delay amount which actually occurs in the data path, in response to the reset signal RST. The high-level period REPD of the first delay amount pulse REPOSC corresponds to a modeled delay amount. In this case, the delay amount required to lock the open-loop-type DLL 110 becomes n*tCK-REPD, where n is an integer larger than zero.

The clock control section 112B outputs a clock signal CLK to the pulse generation section 112C in response to the reset signal RST.

The pulse generation section 112C receives the first delay amount pulse REPOSC and the clock signal CLK and generates a second delay amount pulse DPULSE having a pulse width corresponding to the delay amount required to lock the open-loop-type DLL 110. Specifically, the first detection signal generator 112C_1 generates a first detection signal DET1 which is activated, for example, at a falling edge of the first delay amount pulses REPOSC, and the second detection signal generator 112C_2 generates a second detection signal DET2 which is deactivated, for example, at a rising edge of the clock signal CLK after the generation of the first detection signal DET1. The latch 112C_3 generates the second delay amount pulse DPULSE which is activated at an activation time of the first detection signal DET1 and deactivated at an activation time of the second detection signal DET2, in response to the first and second detection signals DET1 and DET2, respectively. Meanwhile, the reset signal generator 112C_4 receives the second detection signal DET2 and outputs the reset signal RST by delaying the second detection signal DET2 by a certain time. The certain time may be equal to or longer than a time from when the second detection signal DET2 is generated to when the delay line 116 delays the clock signal CLK in response to the delay code value CODE_DELAY.

The operations of the first and second detection signal generators 112C_1 and 112C_2 included in the pulse generation section 112C will be described in more detail as follows. First, the operation of the first detection signal generator 112C_1 will be described. When the first delay pulse REPOSC becomes a high level, a low-level signal inverted by the second inverter INV2 is applied to the first AND gate AND1, and the first AND gate AND1 outputs a low-level signal as the first detection signal DET1. Meanwhile, since the second delay amount pulse DPULSE is activated after the first detection signal DET1 transits from a low level to a high level, the second delay amount pulse DPULSE maintains a low-level state. Therefore, a high-level signal is applied to a second input terminal of the first AND gate AND1 by the first inverter INV1. In such a state, when the first delay amount pulse REPOSC transits from a high level to a low level, a high-level signal is applied to the first input terminal of the first AND gate AND1 by the second inverter INV2. Furthermore, a high-level signal is applied to a third input terminal of the first AND gate AND1 during a delay time by the third inverter INV3. Therefore, since the high-level signals are applied to all the input terminals of the first AND gate AND1 during the delay time by the third inverter INV3 from a point of time when the first delay amount pulse REPOSC transits from a high level to a low level, the first detection signal DET1 is activated to a high level. Since the output of the third inverter INV3 has a low level after the delay time by the third inverter INV3 passes, the first detection signal DET1 is deactivated to a low level.

Next, the operation of the second detection signal generator 112C_2 will be described. Since the second AND gate AND2 receives the low-level second delay amount pulse DPULSE as the first detection signal DET1 is deactivated, the second AND gate AND2 outputs a low-level signal as the second detection signal DET2. In such a state, when the first detection signal DET1 becomes a high level, the second AND gate AND2 outputs a high-level second detection signal DET2 during a delay time by the fourth inverter INV4 from a point of time when a reset clock signal CLK transits from a low level to a high level. Since the output of the fourth inverter INV4 has a low level after the delay time by the fourth inverter INV4 passes, the second detection signal DET2 is deactivated to a low level.

Although not illustrated in the drawings, the operations of the delay amount coding unit 114 and the delay line 116 will be described. The oscillator section 114A generates an oscillation signal in response to the second delay amount pulse DPULSE, and the counter section 114B counts the number of cycles of the oscillation signal OSC to output as the delay code value CODE_VALUE. That is, the oscillator section 114A generates and outputs the oscillation signal OSC during the activation period of the second delay amount pulse DPULSE. The counter section 114B counts the number of cycles of the generated oscillation signal OSC, encodes the counted number of cycles into the delay code value CODE_DELAY, and outputs the delay code value CODE_DELAY to the delay line 116. The delay line 116 delays the clock signal CLK in response to the delay code value CODE_DELAY applied from the delay amount coding unit 114, and outputs a locked clock signal DLLCLK.

Figure 10:
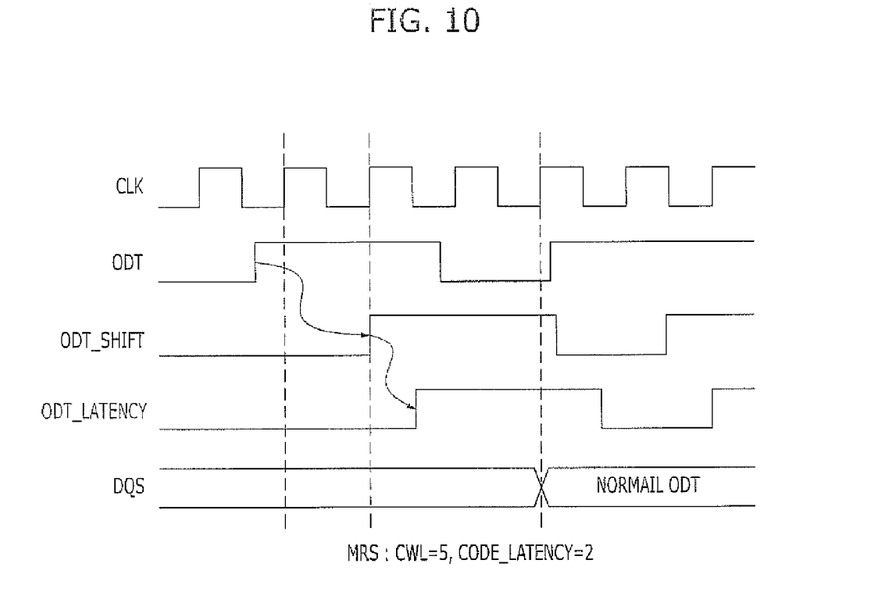
FIG. 10 is a timing diagram explaining the operations of the latency control unit and the additional delay line of FIG. 1.

Referring to FIG. 10, the latency coding unit 120 counts a toggling number of the clock signal CLK during the pulse width of the first delay amount pulse REPOSC, and outputs a latency code value CODE_LATENCY.

Then, the latency control unit 130 outputs a shifted ODT command ODT_SHIFT based on the latency code value CODE_LATENCY and the latency information LI. Here, the latency control unit 130 synchronizes the shifted ODT command ODT_SHIFT with the clock signal CLK, and outputs the synchronized ODT command to the additional delay line 140. More specifically, the signal generation section 132 generates the latency control signal SHIFT_<N> based on an equation expressed as: CWL−2tCK−CODE_LATENCY. For example, when the CWL is set to 5 tCK and the latency code value CODE_LATENCY is 2 tCK, the signal generation section 132 generates the latency control signal SHIFT<N> corresponding to 1 tCK. The shift register 134 shifts the ODT command by 1 tCK in response to the latency control signal SHIFT_<N>, and outputs the shifted ODT command ODT_SHIFT. Here, the shift register 134 outputs the shifted ODT command ODT_SHIFT, which is synchronized with a rising edge of the clock signal CLK, to the additional delay line 140.

The additional delay line 140 delays the shifted ODT command ODT_SHIFT in response to the delay code value CODE_DELAY, and outputs the ODT command ODT_LATENCY of which the operation timing is controlled.

Meanwhile, like the counter section 114B of the delay amount coding unit 114, the latency coding unit 120 updates the latency code value CODE_LATENCY in response to the reset signal RST, in order to deal with PVT variations.

Figure 11:
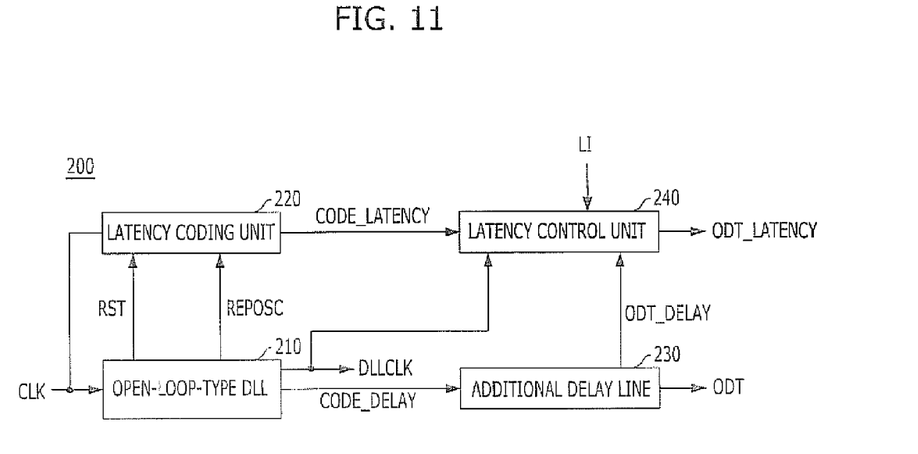
FIG. 11 is a block diagram explaining a semiconductor memory device in accordance with another exemplary embodiment of the present invention.

In an exemplary embodiment of the present invention, the ODT command is synchronized with the clock signal CLK and shifted by the latency control unit 130, and then delayed and outputted by the additional delay line 140. However, referring to FIG. 11, which is a block diagram explaining a semiconductor memory device in accordance with another exemplary embodiment of the present invention, an ODT command may be delayed first by an additional delay line 230, and then synchronized with a locked clock signal DLLCLK and shifted by the latency control unit 240. Since the semiconductor memory device 200 in accordance with this exemplary embodiment of the present invention operates in a similar manner to the semiconductor memory device in accordance with the exemplary embodiment of the present invention described above, the detailed descriptions thereof will be omitted.

In accordance with the exemplary embodiments of the present invention, once the latency code value is calculated by using the pulse generated by the open-loop-type DLL, the calculated code value may be used to continuously control the latency operation. Therefore, the power consumption may decrease.

Furthermore, since a separate domain crossing block is not necessary, a size of a control block area of the semiconductor memory device may decrease.

While the present invention has been described with respect to the specific embodiments, it will be apparent to those skilled in the art that various changes and modifications may be made without departing from the spirit and scope of the invention as defined in the following claims.

For example, the ODT operation mode has been taken as an example in the exemplary embodiments of the present invention. Without being limited thereto, however, the present invention may be applied to a read operation mode, a dynamic ODT (DODT) operation mode and so on. Therefore, although it has been described in the exemplary embodiments of the present invention that one shift register is provided, a plurality of shift registers may be provided in correspondence to the respective operation modes so as to shift commands which are activated in the respective operation modes. The commands may include a read command and a write command for DODT.

What is claimed is:

1. A semiconductor memory device comprising:
an open-loop-type delay locked loop (DLL) configured to generate a clock signal locked by reflecting a first delay amount which actually occurs in a data path and a second delay amount which is required for locking the clock signal;
a latency control unit configured to shift an inputted command according to a latency code value corresponding to the first delay amount and latency information, and output the shifted command; and
an additional delay line configured to delay the shifted command according to a delay code value corresponding to the second delay amount, and output the delayed and shifted command of which operation timing is controlled.

2. The semiconductor memory device of claim 1, wherein the open-loop-type DLL comprises:
a delay amount pulse generation unit configured to generate a second delay amount pulse having a pulse width corresponding to the second delay amount;
a delay amount coding unit configured to measure a pulse width of the second delay amount pulse and output the delay code value; and
a delay line configured to delay the clock signal in response to the delay code value, and output a locked clock signal.

3. The semiconductor memory device of claim 1, wherein the open-loop-type DLL comprises:
a replica delay oscillator section configured to generate a first delay amount pulse and output the generated first delay amount pulse in response to a reset signal;
a clock control section configured to receive the clock signal and output the received clock signal in response to the reset signal;
a pulse generation section configured to receive the first delay amount pulse and the output signal of the clock control section and generate the second delay amount pulse;
an oscillator section configured to generate an oscillation signal in response to the second delay amount pulse;
a first counter section configured to count an oscillation number of the oscillation signal and output the delay code value; and
a delay line configured to delay the clock signal based on the delay code value and output the locked clock signal.

4. The semiconductor memory device of claim 3, wherein the pulse generation section comprises:
a first detection signal generator configured to detect a falling edge of the first delay amount pulse corresponding to a rising edge of the second delay amount pulse, and output a first detection signal;
a second detection signal generator configured to detect a rising edge of the clock signal corresponding to a falling edge of the second delay amount pulse, and output a second detection signal; and
a latch configured to generate the second delay amount pulse in response to the first detection signal and the second detection signal.

5. The semiconductor memory device of claim 4, wherein the pulse generation section further comprises a reset signal generator configured to delay the second detection signal by a certain time and generate the reset signal.

6. The semiconductor memory device of claim 5, wherein the certain time is longer than a time which is required until the clock is signal is delayed by the delay line after the generation of the second detection signal.

7. The semiconductor memory device of claim 5, wherein the latency control unit comprises:
a latency coding section configured to receive the first delay amount pulse having a pulse width corresponding to the first delay amount from the open-loop-type DLL, and measure the pulse width of the first delay amount pulse to output the latency code value; and
a latency control section configured to shift the inputted command according to the latency code value and the latency information, and output the shifted command.

8. The semiconductor memory device of claim 7, wherein the latency coding section updates the latency code value in response to the reset signal.

9. The semiconductor memory device of claim 7, wherein the latency coding section comprises a second counter section configured to count a toggling number of the clock signal during an activation of the first delay amount pulse and output the latency code value.

10. The semiconductor memory device of claim 7, wherein the latency control section synchronizes the inputted command with the clock signal, when shifting the inputted command, and outputs the shifted command.

11. The semiconductor memory device of claim 7, wherein the latency control section comprises:
a signal generation section configured to generate a latency control signal based on the latency code value and the latency information; and
a shifting section configured to shift the inputted command in response to the latency control signal.

12. The semiconductor memory device of claim 11, wherein the signal generation section comprises a full adder or subtractor.

13. The semiconductor memory device of claim 11, wherein the shifting section comprises one or more shift registers.

14. The semiconductor memory device of claim 2, wherein the additional delay line is configured in the same manner as the delay line.

15. The semiconductor memory device of claim 1, wherein the inputted command comprises any one of an on die termination (ODT) command, a read command, and a write command for dynamic ODT.

16. A semiconductor memory device comprising:
an open-loop-type DLL configured to generate a clock signal locked by reflecting a first delay amount which actually occurs in a data path and a second delay amount which is required for locking the clock signal;
a latency coding unit configured to receive a first delay amount pulse having a pulse width corresponding to the first delay amount from the open-loop-type DLL, measure the pulse width of the first delay amount pulse, and output a latency code value;
an additional delay line configured to delay a command according to a delay code value corresponding to the second delay amount inputted from the open-loop-type DLL, and output the delayed command; and
a latency control unit configured to shift the delayed command based on the latency code value and latency information, and output the delayed and shifted command of which operation timing is controlled.

17. The semiconductor memory device of claim 16, wherein the open-loop-type DLL comprises:
a delay amount pulse generation unit configured to generate a second delay amount pulse having a pulse width corresponding to the second delay amount;
a delay amount coding unit configured to measure a pulse width of the second delay amount pulse and output the delay code value; and
a delay line configured to delay the clock signal in response to the delay code value, and output a locked clock signal.

18. The semiconductor memory device of claim 16, wherein the open-loop-type DLL comprises:
a replica delay oscillator section configured to generate the first delay amount pulse and output the generated first delay amount pulse in response to a reset signal;
a clock control section configured to receive the clock signal and output the received clock signal in response to the reset signal;
a pulse generation section configured to receive the first delay amount pulse and the output signal of the clock control section and generate the second delay amount pulse;
an oscillator section configured to generate an oscillation signal in response to the second delay amount pulse;
a first counter section configured to count an oscillation number of the oscillation signal and output the delay code value; and
a delay line configured to delay the clock signal based on the delay code value and output the locked clock signal.

19. The semiconductor memory device of claim 18, wherein the pulse generation section comprises:
a first detection signal generator configured to detect a falling edge of the first delay amount pulse corresponding to a rising edge of the second delay amount pulse, and output a first detection signal;
a second detection signal generator configured to detect a rising edge of the clock signal corresponding to a falling edge of the second delay amount pulse, and output a second detection signal; and
a latch configured to generate the second delay amount pulse in response to the first detection signal and the second detection signal.

20. The semiconductor memory device of claim 19, wherein the pulse generation section further comprises a reset signal generator configured to delay the second detection signal by a certain time and generate the reset signal.

21. The semiconductor memory device of claim 20, wherein the certain time is longer than a time which is required until the clock signal is delayed by the delay line after the generation of the second detection signal.

22. The semiconductor memory device of claim 20, wherein the latency coding unit updates the latency code value in response to the reset signal.

23. The semiconductor memory device of claim 16, wherein the latency coding unit comprises a second counter section configured to count a toggling number of the clock signal during an activation of the first delay amount pulse and output the latency code value.

24. The semiconductor memory device of claim 16, wherein the latency control unit synchronizes the command with the locked clock signal, when shifting the command, and outputs the shifted command.

25. The semiconductor memory device of claim 17, wherein the additional delay line is configured in the same manner as the delay line.

26. The semiconductor memory device of claim 16, wherein the latency control unit comprises:
a signal generation section configured to generate a latency control signal based on the latency code value and the latency information; and
a shifting section configured to shift the delayed command in response to the latency control signal.

27. The semiconductor memory device of claim 26, wherein the signal generation section comprises a full adder or subtractor.

28. The semiconductor memory device of claim 26, wherein the shifting section comprises one or more shift registers.

29. The semiconductor memory device of claim 16, wherein the command comprises any one of an on die termination (ODT) command, a read command, and a write command for dynamic ODT.

* * * * *